(12) United States Patent
Mutaguchi

(10) Patent No.: US 6,352,197 B1
(45) Date of Patent: Mar. 5, 2002

(54) METHOD AND APPARATUS FOR WIRE-BONDING FOR ELECTRIC COMPONENTS

(75) Inventor: Yoshihiko Mutaguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/473,253

(22) Filed: Dec. 27, 1999

(30) Foreign Application Priority Data

Jan. 29, 1999 (JP) .............................................. 11-022464

(51) Int. Cl.⁷ .......................... B23K 31/02; B23K 37/00
(52) U.S. Cl. ..................................... 228/180.5; 228/4.5
(58) Field of Search ............................. 228/4.5, 180.5, 228/1.1, 110.1

(56) References Cited

U.S. PATENT DOCUMENTS

| 3,941,298 A | * | 3/1976 | Nicklaus |
| 5,295,619 A | * | 3/1994 | Takahashi et al. |
| 5,395,037 A | * | 3/1995 | Takahashi et al. |
| 5,421,503 A | * | 6/1995 | Perlberg et al. |
| 5,431,329 A | * | 7/1995 | Hasegawa et al. |
| 5,437,405 A | * | 8/1995 | Asanasavest |
| 5,445,306 A | * | 8/1995 | Huddleston |
| 5,516,029 A | * | 5/1996 | Grasso et al. |
| 5,538,176 A | * | 7/1996 | Hasegawa et al. |
| 5,662,261 A | * | 9/1997 | Fogal |
| 5,884,830 A | * | 3/1999 | Yamazaki et al. |
| 6,158,647 A | * | 12/2000 | Chapman et al. |

FOREIGN PATENT DOCUMENTS

EP         0276928 A2  *  8/1988

* cited by examiner

*Primary Examiner*—Tom Dunn
*Assistant Examiner*—Kiley Stoner
(74) *Attorney, Agent, or Firm*—Beyer Weaver & Thomas LLP

(57) ABSTRACT

Wire-bonding between first and second bonding parts of an electronic component is done by first using a capillary tool to press downward to thereby bond a first end of a metallic wire to the first bonding part and to bend the metallic wire towards the second bonding part and then by using a bonding tool having a sloped lower surface to bond the other end downward towards and onto the second bonding part. The sloped lower surface of the bonding tool is wide enough and extends at least to a center part of the metallic wire and is sloping diagonally upwards towards the first bonding part. The sloped surface may have two sections having different slope angles.

3 Claims, 4 Drawing Sheets

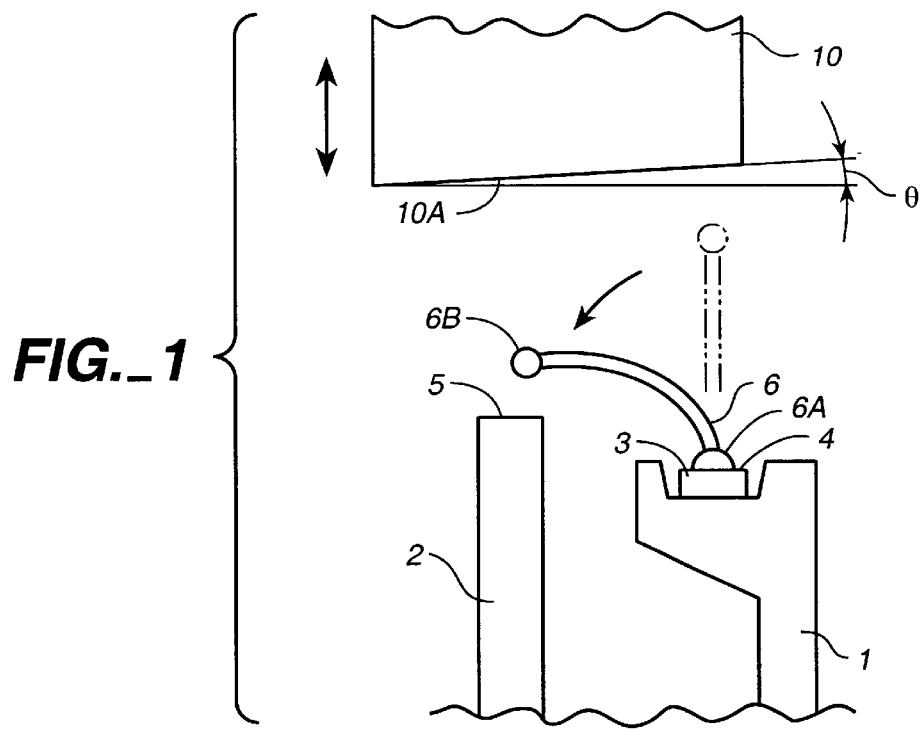
FIG._1
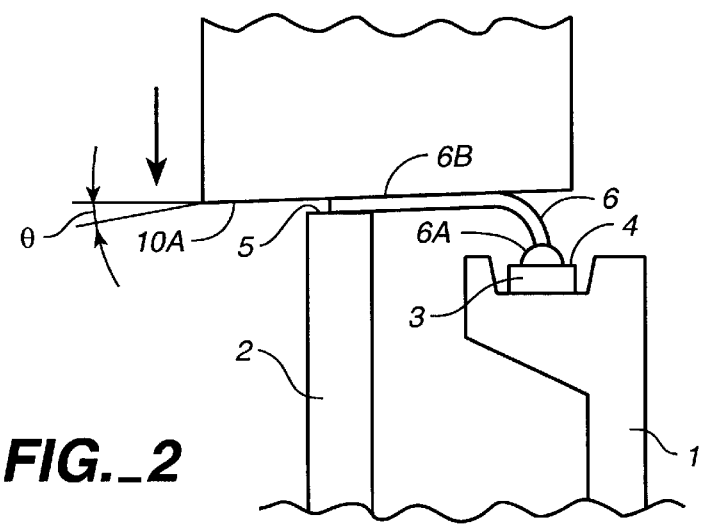
FIG._2

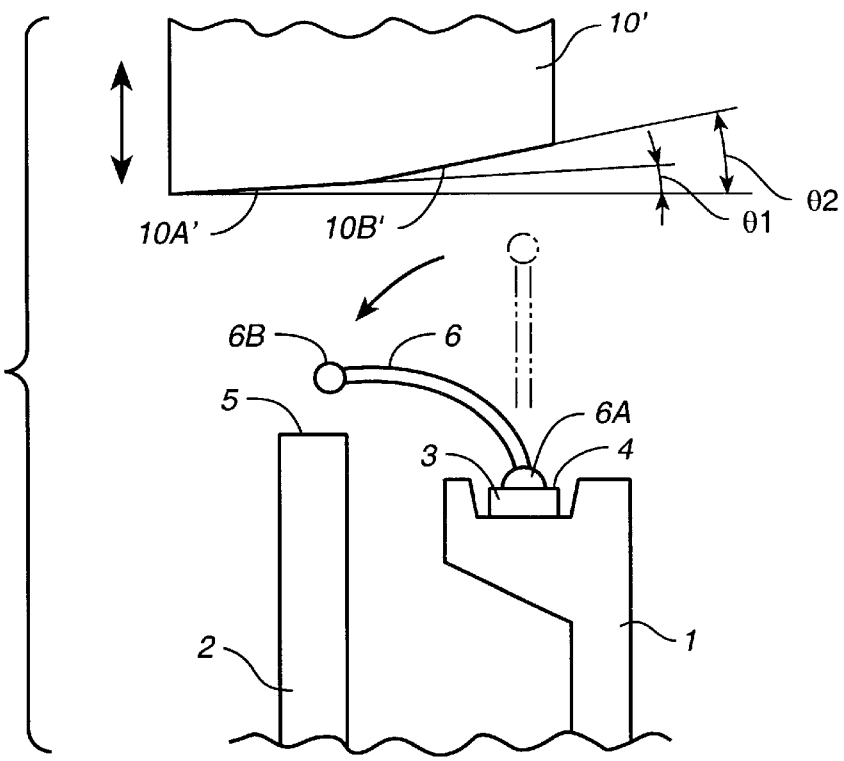
FIG._3
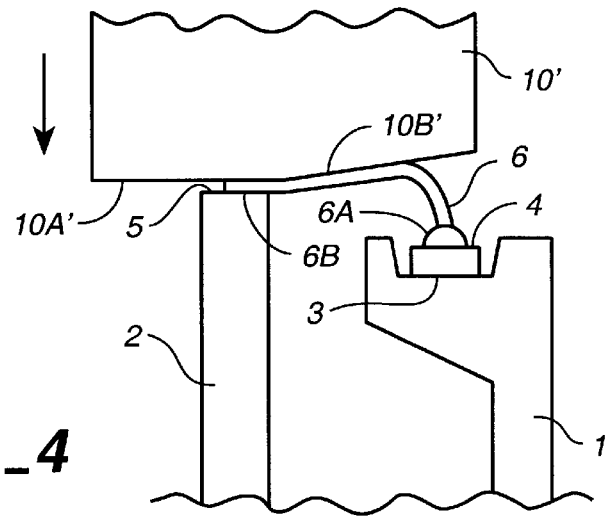
FIG._4

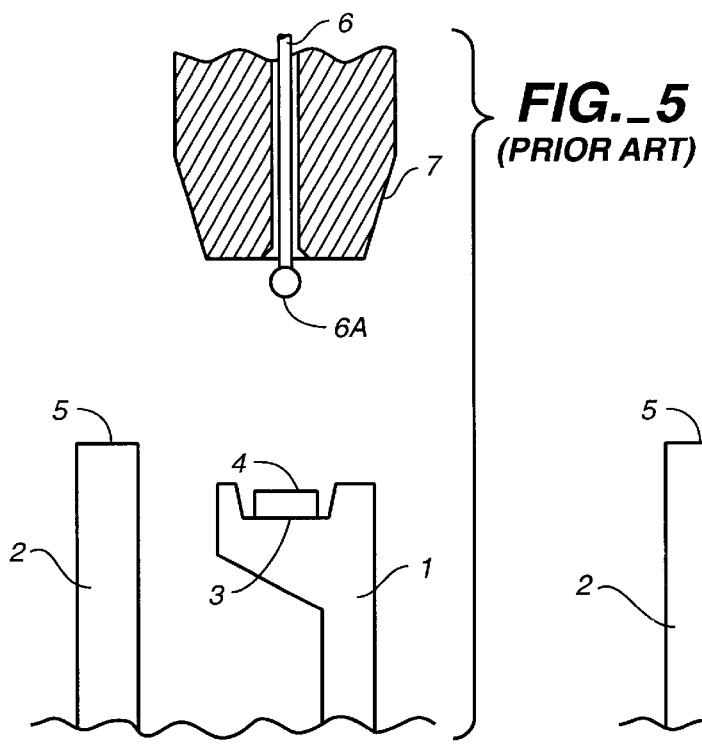
FIG._5 (PRIOR ART)
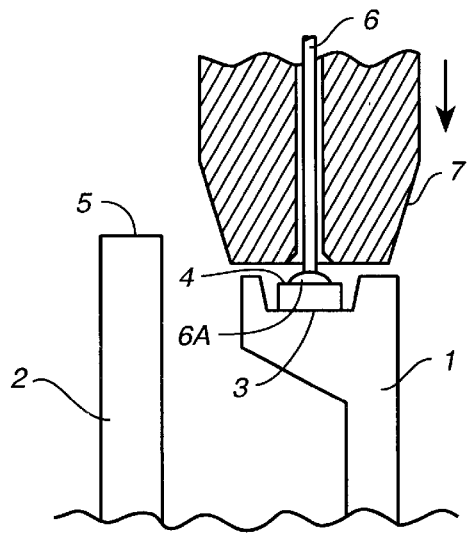
FIG._6 (PRIOR ART)
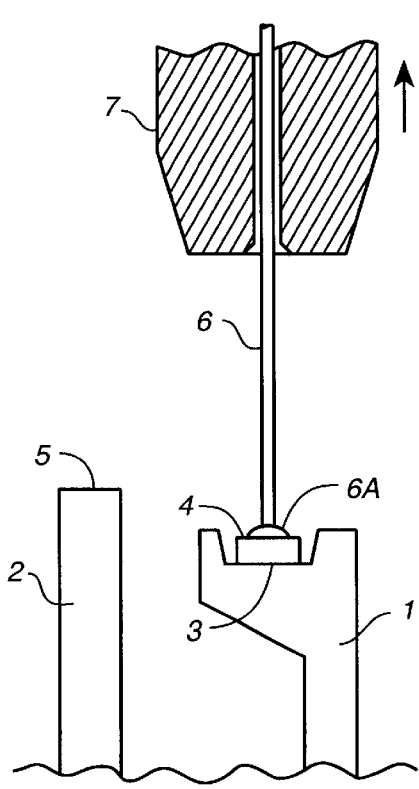
FIG._7 (PRIOR ART)
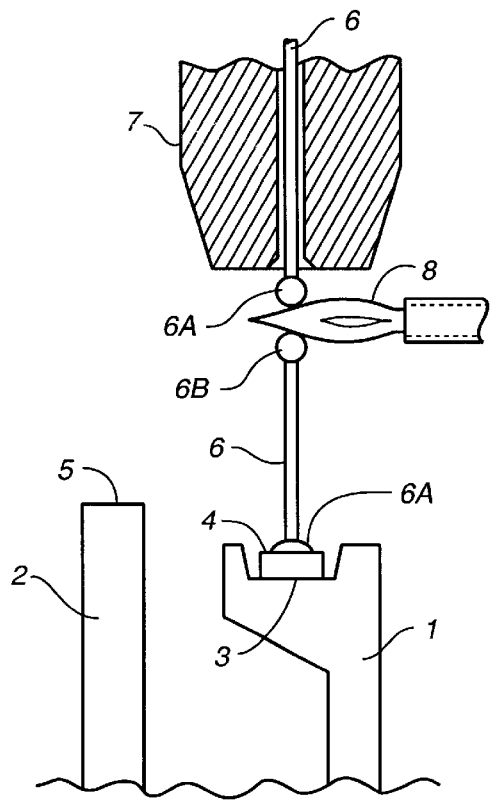
FIG._8 (PRIOR ART)

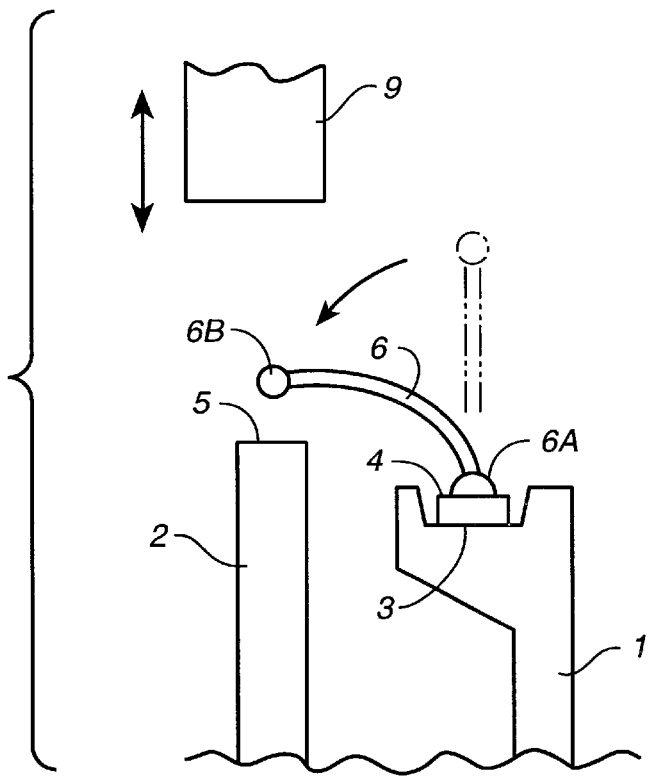
FIG._9
*(PRIOR ART)*
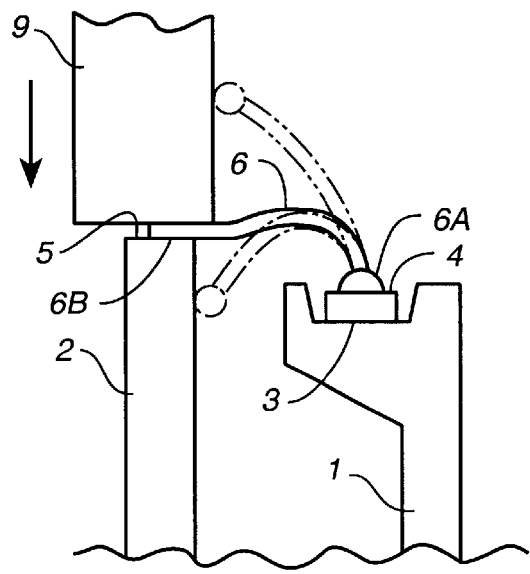
FIG._10
*(PRIOR ART)*

METHOD AND APPARATUS FOR WIRE-BONDING FOR ELECTRIC COMPONENTS

BACKGROUND OF THE INVENTION

This invention relates to a method and apparatus for wire-bonding in the production of electronic components such as light-emitting diodes and transistors, say, for connecting one electrode to another by means of a metallic wire.

FIGS. 5–10 show a wire-bonding method disclosed in Japanese Patent Publication Tokkai 60-39839 for connecting a metallic wire 6 between a first bonding part 4 on the upper surface of a diode chip 3 die-bonded to a cathode 1 of a light-emitting diode and a second bonding part 5 which is on the upper end surface of an anode 2, as shown in FIG. 5–10. This is done firstly by forming a small ball 6A at the lower end of the metallic wire 6 passing through a capillary tool 7 above the first bonding part 4 as shown in FIG. 5 and secondly by moving the capillary tool 7 downward towards the first bonding part 4 such that the ball 6A at the lower end of the metallic wire 6 is bonded to the first bonding part 4 on the diode chip 3 as shown in FIG. 6. The capillary tool 7 is raised again thereafter as shown in FIG. 7. Next, the metallic wire 6 is cut by a torch flame 8 and at the same time two small balls 6A and 6B are created at both ends parts of the severed metallic wire 6 as shown in FIG. 8. Next, the metallic wire 6 which is bonded at one end to the first bonding part 4 is bent in the direction of the second bonding part 5 as shown in FIG. 9 and the ball 6B at its free end is pressed against the second bonding part 5 by lowering a bonding tool 9 as shown in FIG. 10.

The bonding tool 9 to be used for this process is conventionally of a width W which is approximately equal to the width S of the second bonding part 5. Thus, when the metallic wire 6 is bent as shown in FIG. 9 and the ball 6B at its tip is pressed against the second bonding part 5, the ball 6B may slip away from the lower surface of the bonding tool 9 or end up somewhere other than the second bonding part 5 as shown by broken lines in FIG. 10. This may happen in part because the metallic wire 6 is not sufficiently bent. One of the methods for preventing such occurrences is to increase the width W of the bonding tool 9 in the direction of the first bonding part 4 such that the ball 6B will surely be in touch with the lower surface of the bonding tool 9. If the bonding tool 9 is thus modified, however, some of the other parts of the metallic wire 6 will tend to be bent excessively. As a result, the strength of the wire-bonding may be adversely affected or the metallic wire 6 may cause a short-circuiting.

SUMMARY OF THE INVENTION

It is therefore an object of this invention to provide a method and apparatus for wire-bonding with which the problems as described above can be eliminated all at once.

A wire-bonding method embodying this invention, with which the above and other objects can be accomplished, may be characterized as comprising the steps of bonding one end of a metallic wire to a first bonding part of an electronic component, bending the other end of this metallic wire obliquely towards a second bonding part of the electronic component, and pressing the other end downward towards and onto the second bonding part by a sloped surface which extends at least to a center part of the metallic wire and is sloping diagonally upwards towards the first bonding part. A wire-bonding apparatus of this invention is characterized as comprising a capillary tool for bonding one end of a metallic wire therethrough on a first bonding part of an electronic component by pressing downward, and a bonding tool having a lower surface which is wide enough to extend to a mid-point of the metallic wire and is sloped upwards towards the first bonding part for bonding the other end of the metallic wire on a second bonding part of the electronic component by pressing downward.

By using a method or apparatus according to this invention, the second end of the metallic wire, after its first end has been bonded to the first bonding part, can be pressed against the second bonding part dependably and the probability of the wire bending excessively when it is being pressed downward by the bonding tool can be significantly reduced.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIGS. 1 and 2 are schematic drawings for showing a method and a bonding tool embodying this invention;

FIGS. 3 and 4 are schematic drawings for showing another method and bonding tool embodying this invention;

FIG. 5 is a schematic drawing of a prior art capillary tool being used as a part of apparatus embodying this invention; and FIGS. 6–10 are schematic drawings for showing a prior art bonding tool being used in a prior art wire-bonding method.

Throughout herein, equivalent or at least similar components are indicated by the same symbols and may not necessarily be described repetitiously for the convenience of description.

DETAILED DESCRIPTION OF THE INVENTION

The invention is described next by way of examples with reference to the drawings.

In FIGS. 1 and 2, numerals 1 and 2 respectively indicate a cathode and an anode of a light-emitting diode. A diode chip 3 with a first bonding part 4 on its upper surface is already bonded to the cathode 1, and a ball 6A formed at the lower end of a metallic wire 6 is bonded to the first bonding part 4 by means of a capillary tool (not shown in FIGS. 1 and 2) as explained above with reference to FIGS. 5–8 by a prior art method. The metallic wire 6 is also already bent towards a second bonding part 5 on the upper end surface of the anode 2. Numeral 10 indicates a bonding tool according to this invention characterized not only as having its width increased in the direction of the first bonding part 4 so as to reach at least about the center of the metallic wire 6 but as having its lower surface 10A sloped somewhat (indicated by an angle θ) upward towards the first bonding part 4.

With the bonding tool 10 thus structured, the bonding tool 10 can dependably keep the ball 6B in contact with its sloped lower surface 10A as it is lowered and continues to bend the metallic wire 6 even further. In other words, the bonding tool 10 of this invention can more dependably carry out the wire-bonding of the ball 6B on the second bonding part 5, preventing the metallic wire 6 from becoming excessively bent as it is pressed downward.

In FIGS. 3 and 4, same numerals are used to indicate the equivalent or substantially similar components. FIGS. 3 and 4 show another bonding tool 10' designed differently in that its lower surface is divided into a first sloped part 10A' and a second sloped part 10B', the first sloped part 10A' on the side in the direction towards the second bonding part 5 and having a sloping angle of $\theta_1$ which is smaller than the sloping angle $\theta_2$ of the second sloped part 10B', both sloped parts 10A' and 10B' being sloping upwards towards the first bonding part 4.

The bonding tool 10' shown in FIGS. 3 and 4 are more advantageous in that the middle part of the metallic wire 6 is pressed in the shape of the second sloped part 10B' and that the metallic wire 6 can be more dependably prevented from becoming bent excessively.

The invention has been illustrated by way of only a limited number of examples but these examples are not intended to limit the scope of the invention. Many modifications and variations are possible within the scope of the invention. For example, this invention can be applied to the wire-bonding in the production of many other kinds of electronic components such as the bonding between a semiconductor chip bonded to a lead frame and a lead terminal. All such modifications and variations that may be apparent to a person skilled in the art are intended to be included within the scope of the invention.

What is claimed is:

1. A wire-bonding method comprising the steps of:

bonding one end of a metallic wire to a first bonding part of an electronic component such that said metallic wire extends vertically upward from said one end to an opposite end; and pressing said opposite end downward towards and onto a second bonding part by a sloped surface which extends at least to a center part of said metallic wire and is sloping diagonally upwards towards said first bonding part.

2. The wire-bonding method of claim 1 wherein said sloped surface has a first sloped part with a first slope angle and a second slope part with a second slope angle, said first sloping part being towards said second bonding part with respect to said second sloping part, said second slope angle being larger than said first slope angle.

3. A wire-bonding method comprising the steps of:

providing a metallic wire having a first end and a second end and an electronic component having a first bonding part and a second bonding, part;

bonding said first end of said wire to said first bonding part of said electronic component such that said metallic wire extends vertically upward from said first end to said second end; and pressing said second end of said wire downward and onto said second bonding part of said electronic component by a sloped surface which extends at least to a center part of said metallic wire and is sloping diagonally upward towards said first bonding part.

* * * * *